United States Patent
Gershon et al.

(12) 
(10) Patent No.: US 9,716,195 B2
(45) Date of Patent: Jul. 25, 2017

(54) DRY ETCH METHOD FOR TEXTURING SILICON AND DEVICE

(71) Applicant: INTERNATIONAL BUSINESS MACHINES CORPORATION, Armonk, NY (US)

(72) Inventors: Talia S. Gershon, White Plains, NY (US); Richard A. Haight, Mahopac, NY (US); Jeehwan Kim, Los Angeles, CA (US); Yun Seog Lee, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 14/747,954

(22) Filed: Jun. 23, 2015

(65) Prior Publication Data
US 2016/0351734 A1    Dec. 1, 2016

Related U.S. Application Data

(63) Continuation of application No. 14/727,450, filed on Jun. 1, 2015.

(51) Int. Cl.
| | |
|---|---|
| *H01L 31/0236* | (2006.01) |
| *H01L 31/036* | (2006.01) |
| *H01L 31/18* | (2006.01) |
| *H01L 31/20* | (2006.01) |

(52) U.S. Cl.
CPC .. *H01L 31/02366* (2013.01); *H01L 31/02363* (2013.01); *H01L 31/036* (2013.01); *H01L 31/1804* (2013.01); *H01L 31/1864* (2013.01); *H01L 31/208* (2013.01)

(58) Field of Classification Search
None
See application file for complete search history.

(56) References Cited

U.S. PATENT DOCUMENTS

| | | | |
|---|---|---|---|
| 3,679,502 A | 7/1972 | Hays | |
| 5,266,157 A | 11/1993 | Kadomura | |
| 5,310,456 A * | 5/1994 | Kadomura | H01L 21/3065 257/E21.218 |
| 5,314,576 A | 5/1994 | Kadomura | |

(Continued)

FOREIGN PATENT DOCUMENTS

| | | |
|---|---|---|
| CN | 104124307 A | 10/2014 |
| JP | 07193053 A | 7/1995 |

(Continued)

OTHER PUBLICATIONS

Choudhury et al ; "Hydrogen Sulfide as an Etchant for Silicon", J. ElectroChem. Soc.; Electrochemical Technology; Apr. 1969; p. 539-541.*

(Continued)

*Primary Examiner* — Shamim Ahmed
(74) *Attorney, Agent, or Firm* — Tutunjian & Bitetto, P.C.; Louis J. Percello

(57) ABSTRACT

A method for texturing silicon includes loading a silicon wafer into a vacuum chamber, heating the silicon wafer and thermal cracking a gas to generate cracked sulfur species. The silicon wafer is exposed to the cracked sulfur species for a time duration in accordance with a texture characteristic needed for a surface of the silicon wafer.

16 Claims, 6 Drawing Sheets

(56) References Cited

U.S. PATENT DOCUMENTS

| | | | |
|---|---|---|---|
| 9,287,426 B1* | 3/2016 | Bojarczuk | H01L 31/0326 |
| 2009/0026053 A1 | 1/2009 | Lerenius | |
| 2010/0051577 A1 | 3/2010 | Rueger | |
| 2012/0129278 A1* | 5/2012 | Yoshii | B81C 1/00087 |
| | | | 438/14 |
| 2013/0069204 A1* | 3/2013 | Duffy | H01L 21/67069 |
| | | | 257/618 |
| 2013/0081694 A1* | 4/2013 | Nakayama | H01L 31/03682 |
| | | | 136/258 |
| 2014/0045338 A1* | 2/2014 | Tohnoe | H01L 21/3065 |
| | | | 438/719 |

FOREIGN PATENT DOCUMENTS

| | | |
|---|---|---|
| KR | 101215543 B1 | 12/2012 |
| KR | 1020140060599 A | 5/2014 |

OTHER PUBLICATIONS

Legtenberg, R., et al., "Anisotrapic Reactive ion Etching of Silicon Using SF6/O2/CHF3 Gas Mixtures," Journal of the Electrochemical Society, vol. 146, No. 6. Jun. 1995 (pp. 2020-2028).

Reiche, M., et al., "Modification of Si(100)-Surfaces by SF6 Plasma Etching-Application to Wafer Direct Bonding," Crystal Research and Technology, vol. 35, Issue 6-7, Jul. 2000. (pp. 807-821).

* cited by examiner

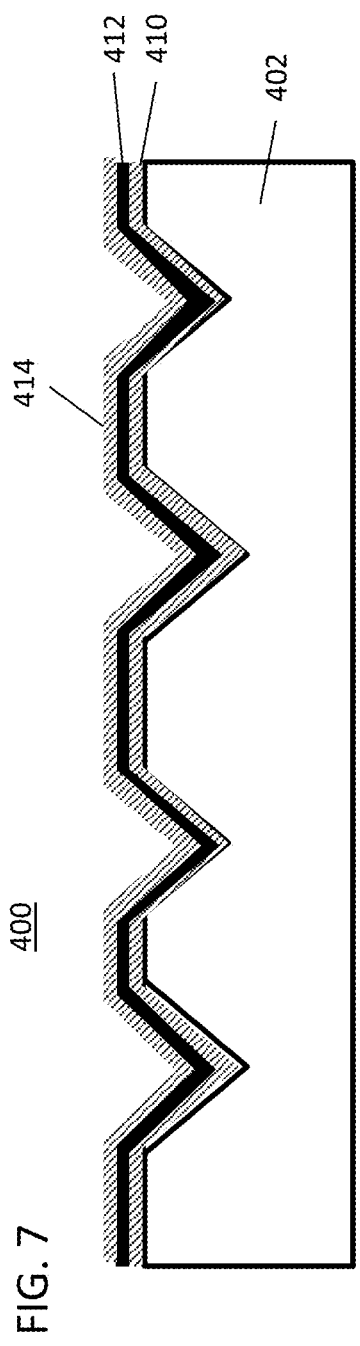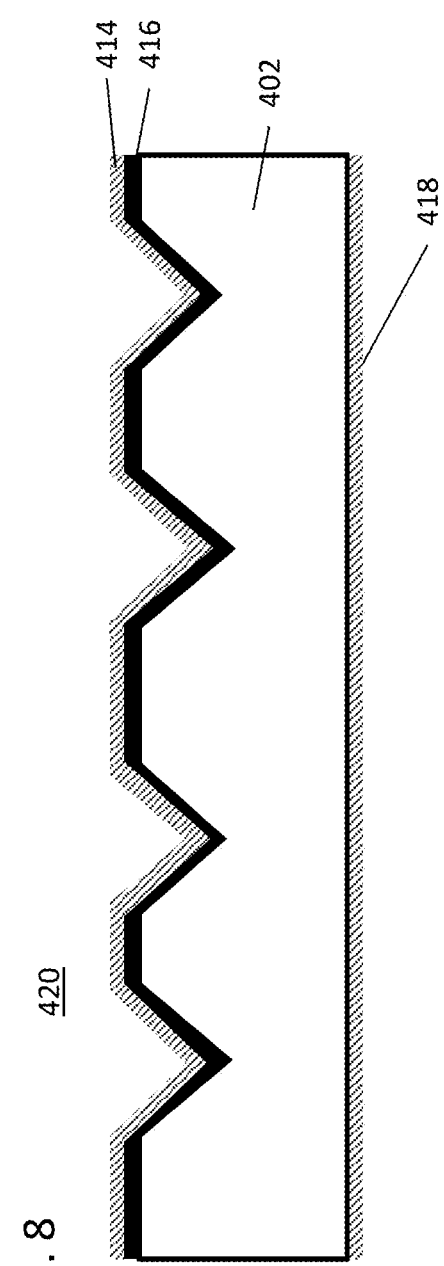

DRY ETCH METHOD FOR TEXTURING SILICON AND DEVICE

RELATED APPLICATION DATA

This application is a Continuation application of co-pending U.S. patent application Ser. No. 14/727,450 filed on Jun. 1, 2015, incorporated herein by reference in its entirety.

GOVERNMENT RIGHTS

This invention was made with Government support under CONTRACT NUMBER: DE-EE0006334 awarded by Department of Energy. The Government has certain rights in this invention.

BACKGROUND

Technical Field

The present invention relates to processing of substrates, and more particularly to a dry etch method for texturing substrates using cracked sulfur.

Description of the Related Art

Various applications employ anisotropically-etched silicon. Many methods for texturing silicon require highly toxic gases (e.g., $SF_6$) and/or require specific tooling (e.g., reactive ion etch (RIE) chambers). The toxicity of the gases and the need for special tooling contribute to elevated costs of silicon devices processed in such as a way. Methods for anisotropic etching of Si are more expensive as they require high capital equipment costs and toxic gas handling.

SUMMARY

A method for texturing silicon includes loading a silicon wafer into a vacuum chamber, heating the silicon wafer and thermal cracking a gas to generate cracked sulfur species. The silicon wafer is exposed to the cracked sulfur species for a time duration in accordance with a texture characteristic needed for a surface of the silicon wafer.

Another method for texturing silicon includes cleaning a silicon wafer to remove oxide; loading the silicon wafer into a vacuum chamber; degassing the wafer to expose a clean Si surface; heating the silicon wafer in the vacuum chamber to a temperature greater than about 350 degrees C.; flowing thermally cracked sulfur species into the vacuum chamber; anisotropically etching the silicon wafer with the cracked sulfur species for a time duration in accordance with a texture characteristic needed for a surface of the silicon wafer; and exhausting volatile Si—S specifies generated by etching the silicon wafer.

A photovoltaic device includes a textured silicon substrate including pyramidal shaped recesses formed in a surface thereof, the pyramidal shaped recesses including exposed (111) silicon surfaces. A junction layer is formed in accordance with the textured silicon substrate. A first electrode layer is formed in contact with the silicon substrate. A second electrode layer is formed over the junction layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 7 is a schematic of cross-sectional view of the silicon wafer having a second electrode layer formed on the diode stack in accordance with the present principles;

FIG. 8 is a schematic of cross-sectional view of a textured silicon wafer included as a component of a photovoltaic device in accordance with the present principles.

DETAILED DESCRIPTION

Figure 1:
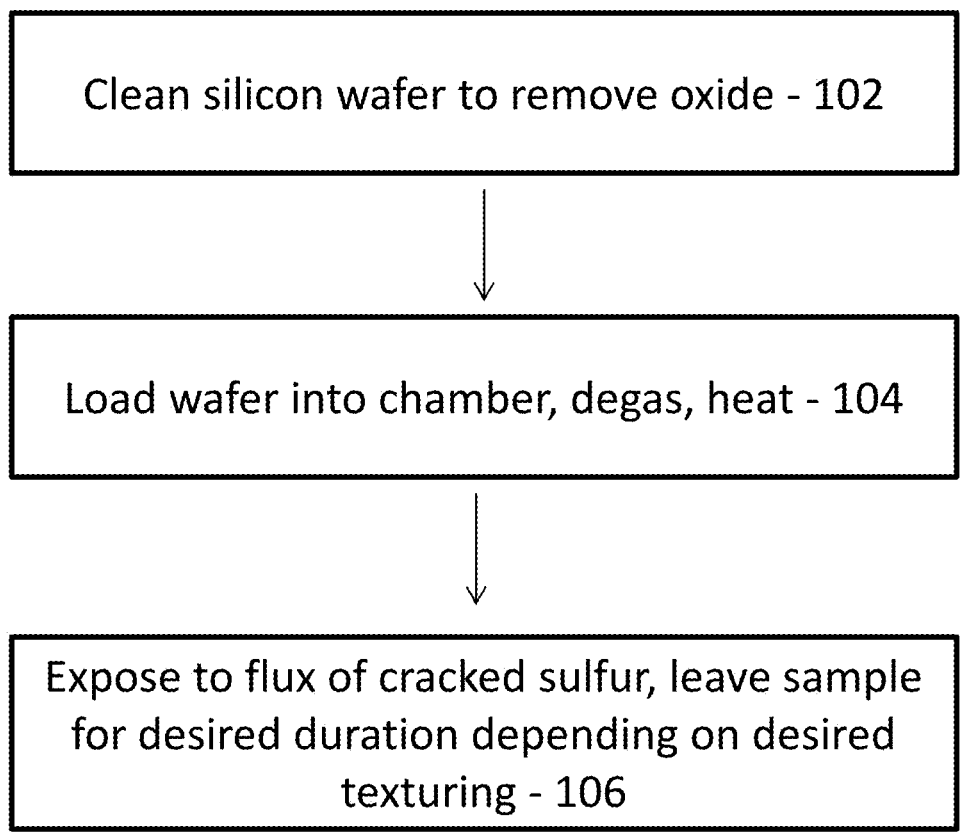
FIG. 1 is a block/flow diagram showing a method for etching to texture silicon in accordance with the present principles.

In accordance with the present principles, anisotropic etching processes are provided where the etching process employs a highly reactive but less toxic gas. In one embodiment, thermally-cracked sulfur, which is highly reactive, forms Si—S compounds, which can be removed at modest temperatures. This process exposes the Si (111) surface by etching a (100) wafer. The cracked sulfur can be prepared using a commercial source or by employing a custom-built apparatus. The sulfur source preferably includes 2-zones where a "bulk zone" containing sulfur (molecules of $S_2$ to $S_8$) is heated to modest temperature (100-200 degrees C.), and the gas then passes through a "cracking zone" held at a temperature greater than about 400 degrees C. (preferably greater than about 500 degrees C.) to break the molecules down into atomic S species. The atomic S species are then directed towards the Si wafer, which is heated to a temperature at which Si—S species are volatile, thereby etching the wafer. The (111) surface becomes exposed and forms a textured surface.

It is to be understood that the present invention will be described in terms of a given illustrative architecture having a substrate or wafer; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The substrates or wafers etched in accordance with the present principles may be employed as part of a device design. A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case, the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a method for texturing a substrate is shown in accordance with one embodiment. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a silicon wafer is cleaned to prepare its surface for processing. Different cleaning techniques may be employed. In one embodiment, an HF dip may be employed to remove oxide from the wafer. The wafer preferably includes a monocrystalline wafer although polycrystalline substrates may also be employed. Other materials such as SiGe, SiC, etc. may also be employed.

In block 104, a wafer is loaded into a processing chamber for texturing. The processing chamber includes a vacuum chamber, which is evacuated and heated to a temperature of at least 600 degrees C. to "degas" the wafer (e.g., remove the hydrogen termination from the surface). The substrate is then held at a temperature greater than about 350 degrees C. In one particularly useful embodiment, the substrate is heated to a temperature of between about 450 degrees C. and about 500 degrees C. The temperature is maintained to achieve equilibrium (e.g., the wafer temperature reaches approximately 450-500 degrees C.).

In block 106, the wafer is dry etched using thermally-cracked sulfur. The wafer is exposed to flux of the cracked sulfur for the needed duration. The duration is proportional to the amount of texturing desired for the wafer. The cracked sulfur is highly reactive with the Si of the wafer and forms Si—S species which can be removed at modest temperatures, e.g., greater than about 400 degrees C. The rate of removal of volatile Si—S species depends on the crystallographic direction in the Si, and preferentially expose the (111) surfaces, e.g., from a (100) Si wafer.

The cracked sulfur may be prepared using a commercial source or a custom-built apparatus. Thermal cracking is a refining process in which heat is employed to break down the larger $S_2$ to $S_8$ molecules into atomic sulfur (its most reactive form).

In one particularly useful embodiment, a 2-zone device is employed where $S_2$ to $S_8$ gas passes from a first chamber (herein referred to as the "bulk zone") held at a temperature of approximately 100-200 degrees C. through a second zone referred to as a "cracking zone", which is functionally a tube held at greater than about 400 degrees C. Once thermally cracked, the atomic S species are directed into the chamber towards the wafer. The atomic S gas reacts with the wafer and reaction products are removed. The products are significantly less toxic than conventional dry etching processes. In addition, the dry etching occurs by managing the gas in the chamber as opposed to reactive ion etching or other high voltage etch processes. In addition, the dry etch process is anisotropic, selectively removing Si to expose (111) surfaces from a Si (100) wafer.

In one embodiment, a crucible is heated to generate a sulfur beam flux (which may include, e.g., $S_n$, where n=8, 7, 6, 5, 3, 2). Gas flow is regulated through a needle valve into an independently heated cracking zone. The temperature of the cracking zone may be adjusted to generate the sulfur flux or beam of sulfur species. The cracking zone may be constructed of corrosion resistant material, such as, quartz or the like. The cracked sulfur source may include a nozzle that provides flux uniformity and reduces material waste. The source is loaded into the large capacity crucible and heated. A controlled needle valve in a conductance tube regulates the amount of evaporated material which enters a growth chamber (where the wafer is located). The conductance zone temperature is controlled so as to produce beams of cracked material and an integrated nozzle optimizes the flux uniformity across the wafer while minimizing material waste.

Figure 2:
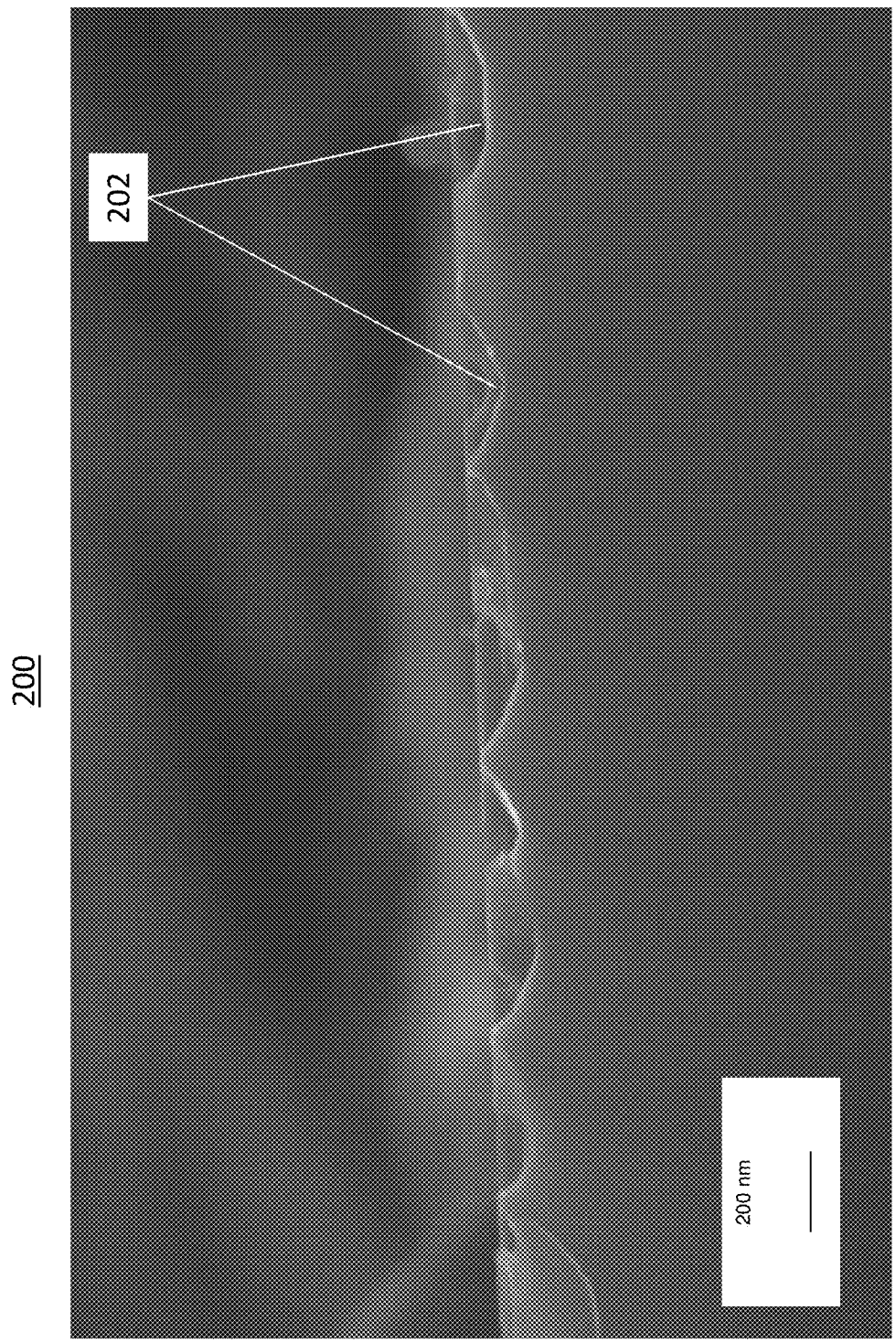
FIG. 2 is a scanning electron microscope image of a cross-section of a silicon wafer after anisotropic etching using cracked sulfur in accordance with the present principles.

Referring to FIG. 2, a scanning electron microscope (SEM) image 200 shows a cross-section of a Si (100) wafer exposed to the anisotropic etch process in accordance with the present principles. The wafer surface includes recesses or craters 202 where Si has been removed to expose (111) surfaces (e.g., sides walls of the craters). The craters may include a depth of about 10 nm to about 300 nm, although other depths are contemplated. The depths of the craters can be repeatably controlled by the duration of exposure in the texturing process, depending on the other process parameters (e.g., S concentration, temperature, flow rate, etc.).

Figure 3:
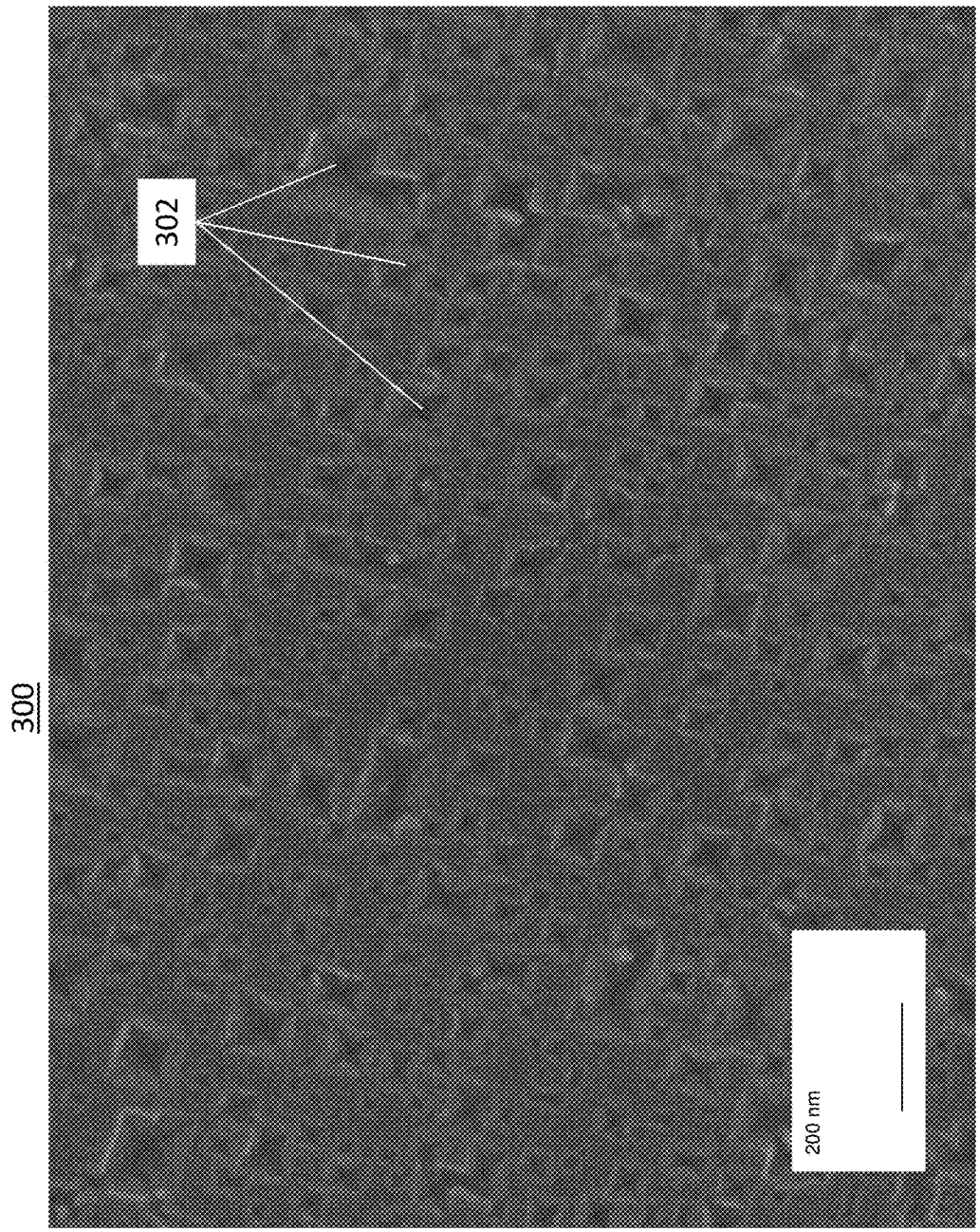
FIG. 3 is a scanning electron microscope image of a top down view of a silicon wafer after anisotropic etching using cracked sulfur in accordance with the present principles.

Referring to FIG. 3, a top down SEM image 300 of Si (100) etched by a reactive S dry etch at 450-500 degrees C. is depicted. The surface includes diamond-shaped craters 302 formed across the surface. The craters form reverse pyramidal recesses with sidewalls being Si (111) surfaces. The size and spacing of the craters is somewhat random. The size of the craters may be between about 20 nm to about 100 nm, although the sizes may be varied to larger or smaller sizes depending on exposure time to the S etchant. Size here refers to a largest distance across the recess or crater as measured from a top surface of the wafer.

Figure 4:
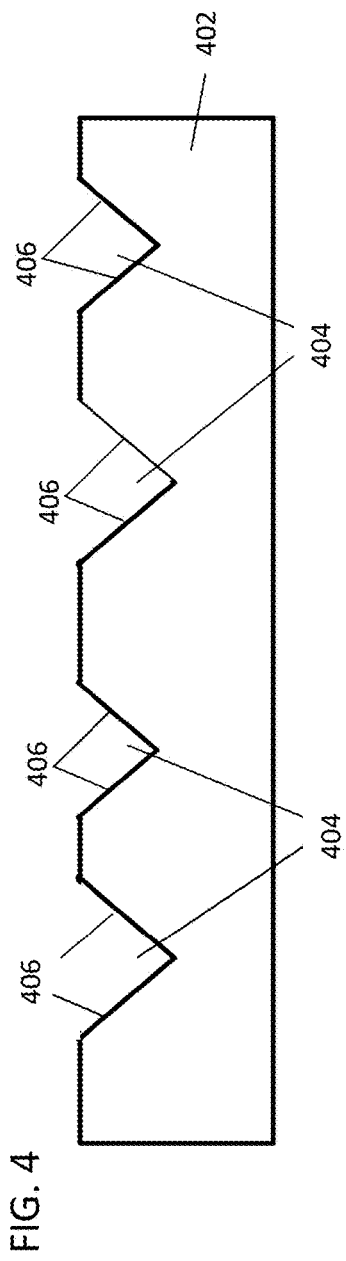
FIG. 4 is a schematic of a cross-sectional view of a silicon wafer having pyramidal recesses formed therein in accordance with the present principles.

Referring to FIG. 4, a silicon wafer 402 textured in accordance with the present principles is illustratively shown. The wafer 402 includes reverse pyramidal recesses 404 with sidewalls 406 being Si (111) surfaces. The textured surface of wafer 402 is particularly useful in absorption related applications such as solar cells, photodetectors, photosensitive devices, etc. The present principles provide photovoltaic devices and methods for fabrication that improve absorption of incident radiation. For high efficiency silicon solar cells, textured silicon is a desired material as it maximizes absorption of a light spectrum and minimizes reflection. In one embodiment, recesses 404 formed in accordance with the present principles may be employed for further forming p-i-n (or n-i-p) diode layers or other layers for the formation of a photovoltaic cell or cells. The following is an illustrative description of one embodiment, other structures, tandem structures, etc. may also be employed with substrate/wafer 402.

Figure 5:
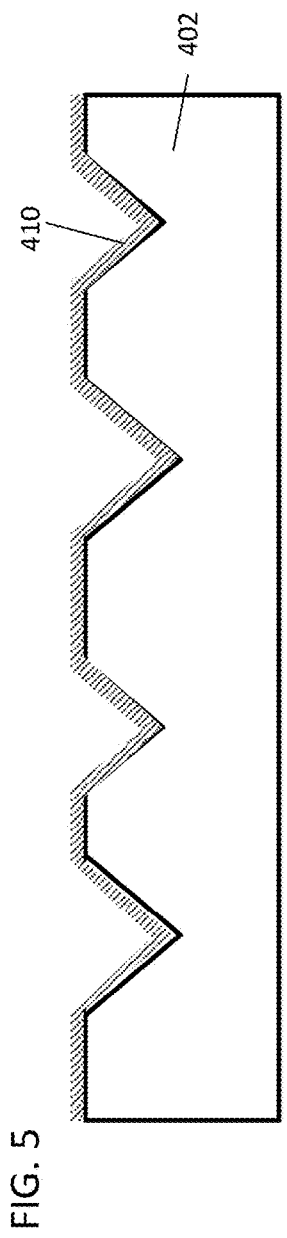
FIG. 5 is a schematic of a cross-sectional view of the silicon wafer having a first electrode layer formed thereon in accordance with the present principles.

Referring to FIG. 5, a first electrode layer 410 is conformally formed on a surface of the wafer 402 by a deposition process. The first electrode layer 410 may include a conductive material such as a transparent conductive oxide (e.g., zinc oxide, indium tin oxide, indium zinc oxide, etc.), ultra-thin metal (e.g., 20 nm or less in thickness) or other conductive structure. The deposition process may include a chemical vapor deposition process or other suitable deposition process.

Figure 6:
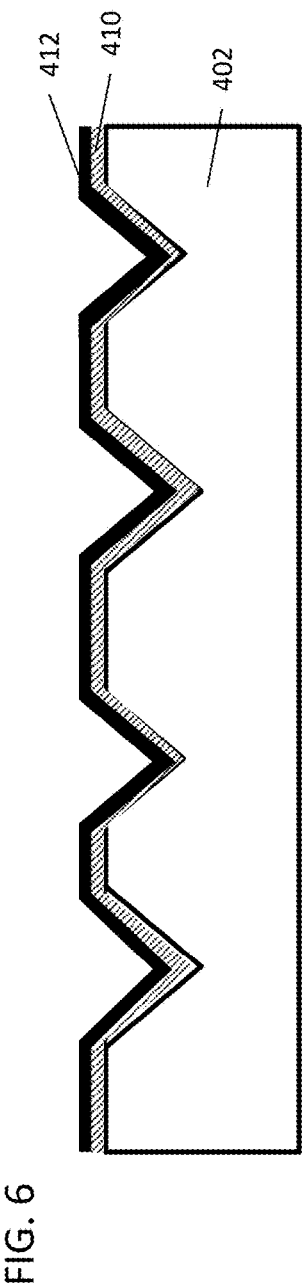
FIG. 6 is a schematic of a cross-sectional view of the silicon wafer having a diode stack formed on the first electrode layer in accordance with the present principles.

Referring to FIG. 6, a junction layer (p-i-n diode stack) 412 is formed over the first electrode 410. The stack or junction layer 412 preferably includes a first doped layer (p-doped layer), and optionally an intrinsic layer (i-layer) and a second doped layer (n-doped layer). The polarity of the doped layers may be reversed. The stack 412 may be formed using a chemical vapor deposition (CVD) or plasma enhance CVD (PECVD) process. The stack 412 provides active areas for absorbing radiation and converting the radiation into charge flow as is known in the art. A plurality of different materials may be selected for the layers in stack 412. In one particularly useful embodiment, the first and second doped layers may include doped polycrystalline/microcrystalline silicon and the intrinsic layer may include undoped amorphous silicon.

Referring to FIG. 7, a second electrode 414 is formed on the stack 412 to form a photovoltaic device 400. The second electrode 414 may include a transparent conductive material such as a transparent conductive oxide (e.g., zinc oxide, indium tin oxide, indium zinc oxide, etc.), ultra-thin metal (e.g., 20 nm or less in thickness) or other conductive structure. The deposition process may include a CVD, PECVD or other suitable deposition process.

The craters or recesses 404 assist in increasing the optical path length of light inside of the absorbing materials, thereby improving absorption. The structures depicted in FIGS. 4-7 may be constructed to receive and scatter light and increase the optical path length of light in the semiconductors and therefore the overall absorption and collection efficiency in any incident light direction as compared with a flat surface cell.

Referring to FIG. 8, the etched silicon wafer 402 may be employed as one component of a Si-based photovoltaic device 420. The silicon wafer 402 may be employed as an absorber layer (e.g., p-type doping) with an electrode 418 formed on a first side, and a buffer layer (or n-type inversion surface) 416 formed on the textured side. The buffer layer 416 may include another electrode 414 (e.g., a transparent electrode) formed thereon. The buffer layer 416 may include amorphous Si (hydrogenated), etc. to form a junction layer (e.g., p-n junction). Other configurations are also contemplated with additional layers or features. It should be noted that the junction layer may include a p-i-n stack, n-i-p stack, a p-n junction or n-p junction. In addition, tandem cells may be added to the photovoltaic device as needed or desired. Tandem cells include additional photovoltaic devices that can be stacked on one another.

Figure 9:
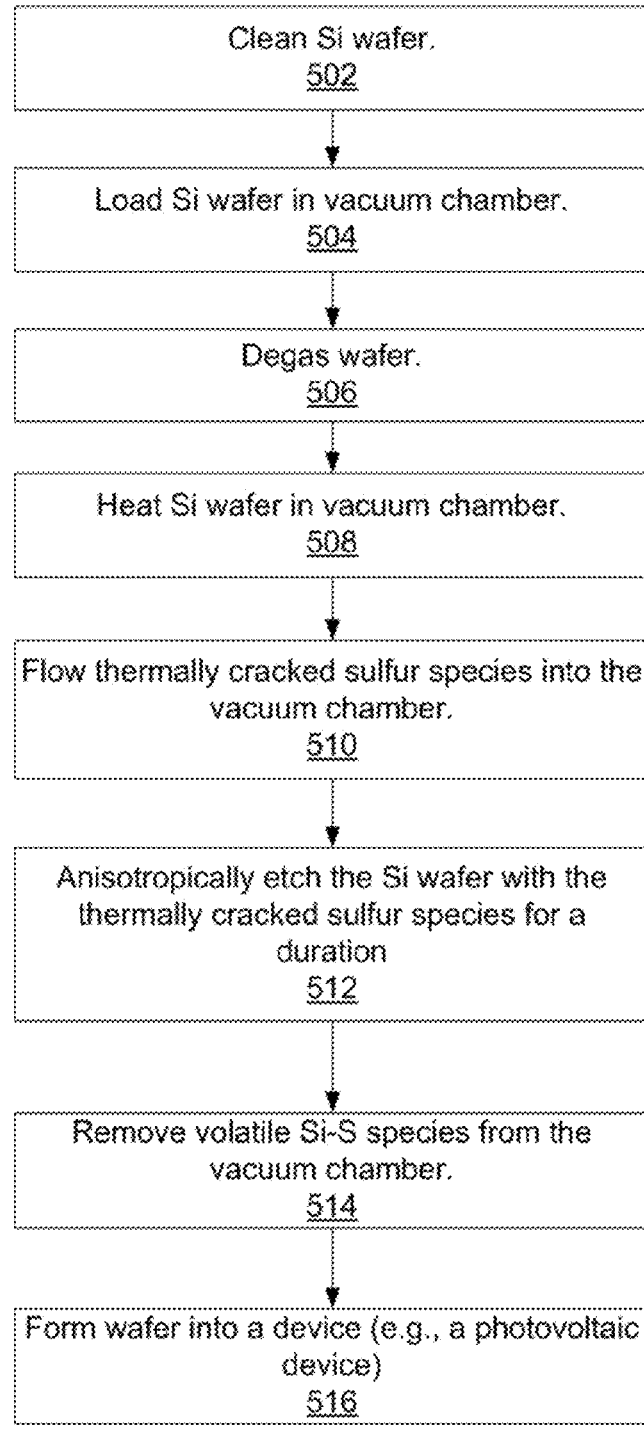
FIG. 9 is a block/flow diagram showing a method for etching to texture silicon in accordance with the present principles.

Referring to FIG. 9, a method for texturing silicon is shown in accordance with illustrative embodiments. In block 502, a silicon wafer is cleaned to remove oxide. This may include an HF etch or other etching or cleaning process.

In block 504, the silicon wafer is loaded into a vacuum chamber. In block 506, the silicon wafer is degassed to remove the surface termination (e.g., hydrogen if using an HF etch to remove the oxide). The base pressure needed may depend on the application. In block 508, the silicon wafer is heated in the vacuum chamber. In one embodiment, the wafer is heated to between about 450 to about 500 degrees C. (or more).

In block 510, thermally cracked sulfur species are flowed into the vacuum chamber towards the Si substrate. The cracked sulfur species may include one or more of $S_n$ where n=8, 7, 6, 5, 3, 2. The thermally cracked sulfur species may be supplied from a sulfur source including a cracking zone with a temperature greater than 400 degrees C.

In block 512, the silicon wafer is anisotropically etched with the cracked sulfur species for a time duration in accordance with a texture characteristic needed for a surface of the silicon wafer. The longer the duration the larger and deeper the recesses for the surface of the wafer. The anisotropic etch may include exposing a (100) silicon wafer to the cracked sulfur species to etch the wafer to expose (111) silicon surfaces. The texture characteristic may include pyramidal recesses formed in the wafer having a depth of between about 10 nm and about 300 nm.

In block 514, volatile Si—S specifies generated by etching the silicon wafer are exhausted or removed from the wafer/chamber. In block 516, the wafer is formed into a device. For example, the device may include a photovoltaic device including a first electrode layer, a p-i-n diode stack and a second electrode layer on the surface of the silicon wafer. Other device structures may also be employed that take advantage of the increased surface area and the light capturing effects or the silicon wafer. For example, the etched silicon wafer itself may be used as one component of a Si-based photovoltaic device. The silicon wafer may be employed as an absorber layer (e.g., p-type) with an electrode formed on a first side and a buffer layer (or n-type inversion surface) formed on the textured side. The buffer layer may include another electrode formed thereon.

Having described preferred embodiments for a dry etch method for texturing silicon (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for texturing silicon, comprising:
loading a silicon wafer into a vacuum chamber;
heating the silicon wafer;
thermal cracking a gas to generate cracked sulfur species, the thermal cracking including passing the gas through a first zone at a first temperature and subsequently through a second zone at a second temperature, the first and second temperatures being different from each other; and
exposing the silicon wafer to the cracked sulfur species for a time duration in accordance with a texture characteristic needed for a surface of the silicon wafer.

2. The method as recited in claim 1, wherein heating includes heating the silicon wafer to a temperature greater than 350 degrees C.

3. The method as recited in claim 1, wherein the first temperature is approximately between 100-200 degrees C. and the second temperature is greater than about 400 degrees C.

4. The method as recited in claim 1, wherein exposing the silicon wafer to the cracked sulfur species includes exposing a (100) silicon wafer to the cracked sulfur species to etch the wafer to expose (111) silicon surfaces.

5. The method as recited in claim 1, wherein the texture characteristic includes pyramidal recesses formed in the wafer having a depth of between about 10 nm and about 300 nm.

6. The method as recited in claim 1, further comprising exhausting volatile Si—S specifies generated by etching the silicon wafer.

7. The method as recited in claim 1, wherein the cracked sulfur species include one or more of $S_n$ where n=8, 7, 6, 5, 3, 2.

8. The method as recited in claim 1, further comprising forming a junction layer, a first electrode layer and a second electrode layer on the surface of the silicon wafer to form a photovoltaic device.

9. A method for texturing silicon, comprising:
cleaning a silicon wafer to remove oxide;
loading the silicon wafer into a vacuum chamber;
degassing the wafer to expose a clean Si surface;
heating the silicon wafer in the vacuum chamber to a temperature greater than about 350 degrees C.;
flowing thermally cracked sulfur species into the vacuum chamber by passing the gas through a first zone at a first temperature and subsequently through a second zone at a second temperature, the first and second temperatures being different from each other;
anisotropically etching the silicon wafer with the cracked sulfur species for a time duration in accordance with a texture characteristic needed for a surface of the silicon wafer; and
exhausting volatile Si—S specifies generated by etching the silicon wafer.

10. The method as recited in claim 9, wherein the first temperature is approximately between 100-200 degrees C. and the second temperature is greater than about 400 degrees C.

11. The method as recited in claim 9, wherein anisotropically etching the silicon wafer includes exposing a (100) silicon wafer to the cracked sulfur species to etch the wafer to expose (111) silicon surfaces.

12. The method as recited in claim 9, wherein the texture characteristic includes pyramidal recesses formed in the wafer having a depth of between about 10 nm and about 300 nm.

13. The method as recited in claim 9, wherein the cracked sulfur species include one or more of $S_n$ where n=8, 7, 6, 5, 3, 2.

14. The method as recited in claim 9, further comprising forming a first electrode layer, a junction layer and a second electrode layer on the surface of the silicon wafer to form a photovoltaic device.

15. The method as recited in claim 1, wherein the first zone is a bulk zone and the second zone is a cracking zone.

16. The method as recited in claim 9, wherein the first zone is a bulk zone and the second zone is a cracking zone.

* * * * *